US011847985B2

(12) United States Patent
Li

(10) Patent No.: US 11,847,985 B2
(45) Date of Patent: Dec. 19, 2023

(54) DISPLAY DEVICE AND DRIVING METHOD THEREOF

(71) Applicant: TCL China Star Optoelectronics Technology Co., Ltd., Guangdong (CN)

(72) Inventor: Wenfang Li, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 381 days.

(21) Appl. No.: 17/255,000

(22) PCT Filed: Dec. 18, 2020

(86) PCT No.: PCT/CN2020/137683
§ 371 (c)(1),
(2) Date: Dec. 22, 2020

(87) PCT Pub. No.: WO2022/116296
PCT Pub. Date: Jun. 9, 2022

(65) Prior Publication Data
US 2023/0122522 A1    Apr. 20, 2023

(30) Foreign Application Priority Data

Dec. 1, 2020  (CN) .......................... 202011386967.X

(51) Int. Cl.
*G09G 3/32* (2016.01)
*G09G 3/34* (2006.01)
*H01L 25/075* (2006.01)

(52) U.S. Cl.
CPC .............. *G09G 3/342* (2013.01); *G09G 3/32* (2013.01); *H01L 25/0753* (2013.01); *G09G 2310/0264* (2013.01); *H01L 2225/04* (2013.01)

(58) Field of Classification Search
CPC .. G09G 3/342; G09G 3/32; G09G 2310/0264; G09G 2360/06;
(Continued)

(56) References Cited
U.S. PATENT DOCUMENTS 8,866,700 B2 * 10/2014 Inami .................... G06F 1/1624
345/1.3
9,727,297 B2 * 8/2017 Eom .................... G09G 3/3233
(Continued)

FOREIGN PATENT DOCUMENTS

CN    1163444    10/1997
CN    101051135    10/2007
(Continued)

OTHER PUBLICATIONS

"Abstract, Method for Improving the Dynamic Contrast of Side-Type Liquid Cystal Display by Using Partitioned Backlight", Full-text Database of China's Outstanding Master's Thesis:3P., Mar. 31, 2020.
(Continued)

*Primary Examiner* — Vijay Shankar

(57) ABSTRACT

The present application proposes a display device and a driving method thereof. The display device includes a display panel and a driving control module. The display panel includes first data lines and second data lines. The driving control module controls each of the first data lines and each of the second data lines to output a first data signal and a second data signal. A high electric potential period of the first data signal is within a low electric potential period of the second data signal. A high electric potential period of the second data signal is within a low electric potential period of the first data signal.

12 Claims, 2 Drawing Sheets

(58) Field of Classification Search
CPC ......... G09G 2310/08; G09G 2330/021; G09G 2320/0686; G09G 2330/025; G06F 3/1446; G06F 3/1438; G06F 3/147; H01L 2225/04; H01L 25/0753; H01L 25/167; H01L 33/62

See application file for complete search history.

(56) References Cited

U.S. PATENT DOCUMENTS

| | | | | |
|---|---|---|---|---|
| 9,766,785 | B2* | 9/2017 | Lee | G06F 3/04842 |
| 10,210,549 | B2* | 2/2019 | Yi | G06Q 30/0246 |
| 11,086,444 | B2* | 8/2021 | Yao | H10K 59/40 |
| 11,263,996 | B2* | 3/2022 | Ryu | G09G 3/3275 |
| 2012/0246600 | A1* | 9/2012 | Abe | G06F 40/242 |
| | | | | 715/853 |
| 2016/0086549 | A1* | 3/2016 | Eom | G06F 3/1423 |
| | | | | 345/690 |
| 2019/0156783 | A1 | 5/2019 | Kim et al. | |

FOREIGN PATENT DOCUMENTS

| | | |
|---|---|---|
| CN | 101276527 | 10/2008 |
| CN | 101409058 | 4/2009 |
| CN | 101620836 | 1/2010 |
| CN | 102124404 | 7/2011 |
| CN | 203102810 | 7/2013 |
| CN | 104978919 | 10/2015 |
| CN | 105739933 | 7/2016 |
| CN | 106716519 | 5/2017 |
| CN | 107092151 | 8/2017 |
| CN | 108257576 | 4/2018 |
| CN | 108320694 | 7/2018 |
| CN | 208488960 | 2/2019 |
| CN | 110930954 | 3/2020 |
| CN | 111091778 | 5/2020 |
| KR | 10-2007-0115537 | 12/2007 |
| KR | 2008-0052907 | 6/2008 |
| TW | 540027 | 7/2003 |
| TW | 200825595 | 6/2008 |

OTHER PUBLICATIONS

"Abstract. Hardware Design of Digital Visual Interface", Electronic Device, 29(4):1280-1287, Dec. 30, 2006.

* cited by examiner

DISPLAY DEVICE AND DRIVING METHOD THEREOF

RELATED APPLICATIONS

This application is a National Phase of PCT Patent Application No. PCT/CN2020/137683 having International filing date of Dec. 18, 2020, which claims the benefit of priority of Chinese Patent Application No. 202011386967.X filed on Dec. 1, 2020. The contents of the above applications are all incorporated by reference as if fully set forth herein in their entirety.

FIELD AND BACKGROUND OF THE INVENTION

The present application is related to the field of display technology, and specifically, to a display device and a driving method thereof.

In recent years, because mini light-emitting diodes (mini-LEDs) can achieve ultra-thin and multi-regions functions, they are widely used in backlight sources of display devices. As people's requirements for display effects of large-size display panels become higher and higher, mini-LEDs will be further used in display panels with high-gray-level displays.

Currently, in order to display images in a high-gray-level display such as a 64-gray-level display, a display panel is at least divided into two display regions and is correspondingly provided with two driving integrated circuits (ICs) to drive the two display regions to display. However, because the two driving ICs drive the display panel with a same phase output, currents driving the two display regions are superimposed at a peak value, resulting in an excess peak current, which increases output requirements of a power supply and increases usage costs.

SUMMARY OF THE INVENTION

The present application provides a display device and a driving method thereof to solve a technical problem of an excess peak current due to a same phase current driving different display regions to display in a current display device.

In order to solve the above problem, the present application provides the following technical solutions.

The present application provides a display device including:

a display panel including a first display region and a second display region arranged side by side along a first direction, wherein the first display region is provided with a plurality of first data lines, the second display region is provided with a plurality of second data lines, and each of the first data lines and each of the second data lines are connected to a light-emitting diode (LED); and a driving control module connected to each of the first data lines and each of the second data lines, wherein the driving control module is configured to drive the first display region and the second display region to display.

Within a display period of one frame of the display panel, the driving control module controls each of the first data lines to output a first data signal to the LED in the first display region and controls each of the second data lines to output a second data signal to the LED in the second display region. A high electric potential period of the first data signal is within a low electric potential period of the second data signal. A high electric potential period of the second data signal is within a low electric potential period of the first data signal.

In the display device provided by an embodiment of the present application, the display period includes a driving display period and a blank period. The driving control module controls a sum of a time of the high electric potential period of the first data signal and a time of the high electric potential period of the second data signal to be equal to a time of the driving display period.

In the display device provided by an embodiment of the present application, of two adjacent first data lines, the driving control module controls an electric potential value output from a longer one of the first data lines within the high electric potential period of the first data signal to be greater than an electric potential value output from a shorter one of the first data lines within the high electric potential period of the first data signal.

In the display device provided by an embodiment of the present application, of two adjacent second data lines, the driving control module controls an electric potential value output from a longer one of the second data lines within the high electric potential period of the second data signal to be greater than an electric potential value output from a shorter one of the second data lines within the high electric potential period of the second data signal.

In the display device provided by an embodiment of the present application, the driving control module at least includes a control chip and a first driving chip and a second driving chip connected to the control chip. The first driving chip is connected to each of the first data lines. The second driving chip is connected to each of the second data lines.

In the display device provided by an embodiment of the present application, the display panel further includes a third display region arranged with the first display region and the second display region side by side along the first direction. The third display region is provided with a plurality of third data lines. Each of the third data lines is connected to an LED. The driving control module is connected to each of the third data lines.

Within the display period of one frame of the display panel, the driving control module controls each of the third data lines to output a third data signal to the LED in the third display region. The high electric potential period of the first data signal, the high electric potential period of the second data signal, and a high electric potential period of the third data signal do not overlap each other.

The present application further provides a display device including:

a display panel including a first display region and a second display region arranged side by side along a first direction, wherein the first display region is provided with a plurality of first data lines, the second display region is provided with a plurality of second data lines, and each of the first data lines and each of the second data lines are connected to a light-emitting diode (LED); and a driving control module connected to each of the first data lines and each of the second data lines, wherein the driving control module is configured to drive the first display region and the second display region to display.

Within a display period of one frame of the display panel, the driving control module controls each of the first data lines to output a first data signal to the LED in the first display region and controls each of the second data lines to output a second data signal to the LED in the second display region. A high electric potential period of the first data signal is within a low electric potential period of the second data signal. A high electric potential period of the second data signal is within a low electric potential period of the first data signal.

The high electric potential period of the first data signal includes a plurality of first high electric potential subperiods. The high electric potential period of the second data signal includes a plurality of second high electric potential subperiods. The driving control module controls each of the first high electric potential subperiods and each of the second high electric potential subperiods to be alternately arranged.

In the display device provided by an embodiment of the present application, the display period includes a driving display period and a blank period. The driving control module controls a sum of a time of the high electric potential period of the first data signal and a time of the high electric potential period of the second data signal to be equal to a time of the driving display period.

In the display device provided by an embodiment of the present application, of two adjacent first data lines, the driving control module controls an electric potential value output from a longer one of the first data lines within the high electric potential period of the first data signal to be greater than an electric potential value output from a shorter one of the first data lines within the high electric potential period of the first data signal.

In the display device provided by an embodiment of the present application, of two adjacent second data lines, the driving control module controls an electric potential value output from a longer one of the second data lines within the high electric potential period of the second data signal to be greater than an electric potential value output from a shorter one of the second data lines within the high electric potential period of the second data signal.

In the display device provided by an embodiment of the present application, the driving control module at least includes a control chip and a first driving chip and a second driving chip connected to the control chip. The first driving chip is connected to each of the first data lines. The second driving chip is connected to each of the second data lines.

In the display device provided by an embodiment of the present application, the display panel further includes a third display region arranged with the first display region and the second display region side by side along the first direction. The third display region is provided with a plurality of third data lines. Each of the third data lines is connected to an LED. The driving control module is connected to each of the third data lines.

Within the display period of one frame of the display panel, the driving control module controls each of the third data lines to output a third data signal to the LED in the third display region. The high electric potential period of the first data signal, the high electric potential period of the second data signal, and a high electric potential period of the third data signal do not overlap each other.

The present application further provides a driving method of a display device. The display device includes:

a display panel including a first display region and a second display region arranged side by side along a first direction, wherein the first display region is provided with a plurality of first data lines, the second display region is provided with a plurality of second data lines, and each of the first data lines and each of the second data lines are connected to a light-emitting diode (LED); and a driving control module connected to each of the first data lines and each of the second data lines, wherein the driving control module is configured to drive the first display region and the second display region to display.

The driving method of the display device includes steps of:

the driving control module controlling each of the first data lines to output a first data signal to the LED in the first display region within a display period of one frame of the display panel; and the driving control module controlling each of the second data lines to output a second data signal to the LED in the second display region, the driving control module controlling a high electric potential period of the first data signal to be within a low electric potential period of the second data signal, and the driving control module controlling a high electric potential period of the second data signal to be within a low electric potential period of the first data signal.

In the driving method of the display device provided by the present application, in the step of the driving control module controlling the high electric potential period of the first data signal to be within the low electric potential period of the second data signal, and the driving control module controlling the high electric potential period of the second data signal to be within the low electric potential period of the first data signal includes steps of:

the driving control module controlling the high electric potential period of the first data signal to include a plurality of first high electric potential subperiods, and the driving control module controlling the high electric potential period of the second data signal to include a plurality of second high electric potential subperiods; and the driving control module controlling each of the first high electric potential subperiods and each of the second high electric potential subperiods to be alternately arranged.

In the driving method of the display device provided by the present application, the display panel further includes a third display region arranged with the first display region and the second display region side by side along the first direction. The third display region is provided with a plurality of third data lines. Each of the third data lines is connected to an LED. The driving control module is connected to each of the third data lines.

The driving method of the display device further includes a step of:

the driving control module controlling each of the third data lines to output a third data signal to the LED in the third display region within the display period of one frame of the display panel, wherein the high electric potential period of the first data signal, the high electric potential period of the second data signal, and a high electric potential period of the third data signal do not overlap each other.

Beneficial effects of the present application are as follows. The present application configures the driving control module to control the first data signal for driving the first display region to display and control the second data signal for driving the second display region, so that the high electric potential period of the first data signal is within the low electric potential period of the second data signal, and the high electric potential period of the second data signal is within the low electric potential period of the first data signal. Therefore, the first data signal and the second data signal are arranged in alternate phases, which prevents an excess peak current due to the first data signal and the second data signal arranged in same phases, reduces a maximum current required for a display of the display device, reduces requirements of the display device for power supply specifications, and saves production costs and usage costs.

BRIEF DESCRIPTION OF THE SEVERAL VIEWS OF THE DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DESCRIPTION OF SPECIFIC EMBODIMENTS OF THE INVENTION

Figure 1:
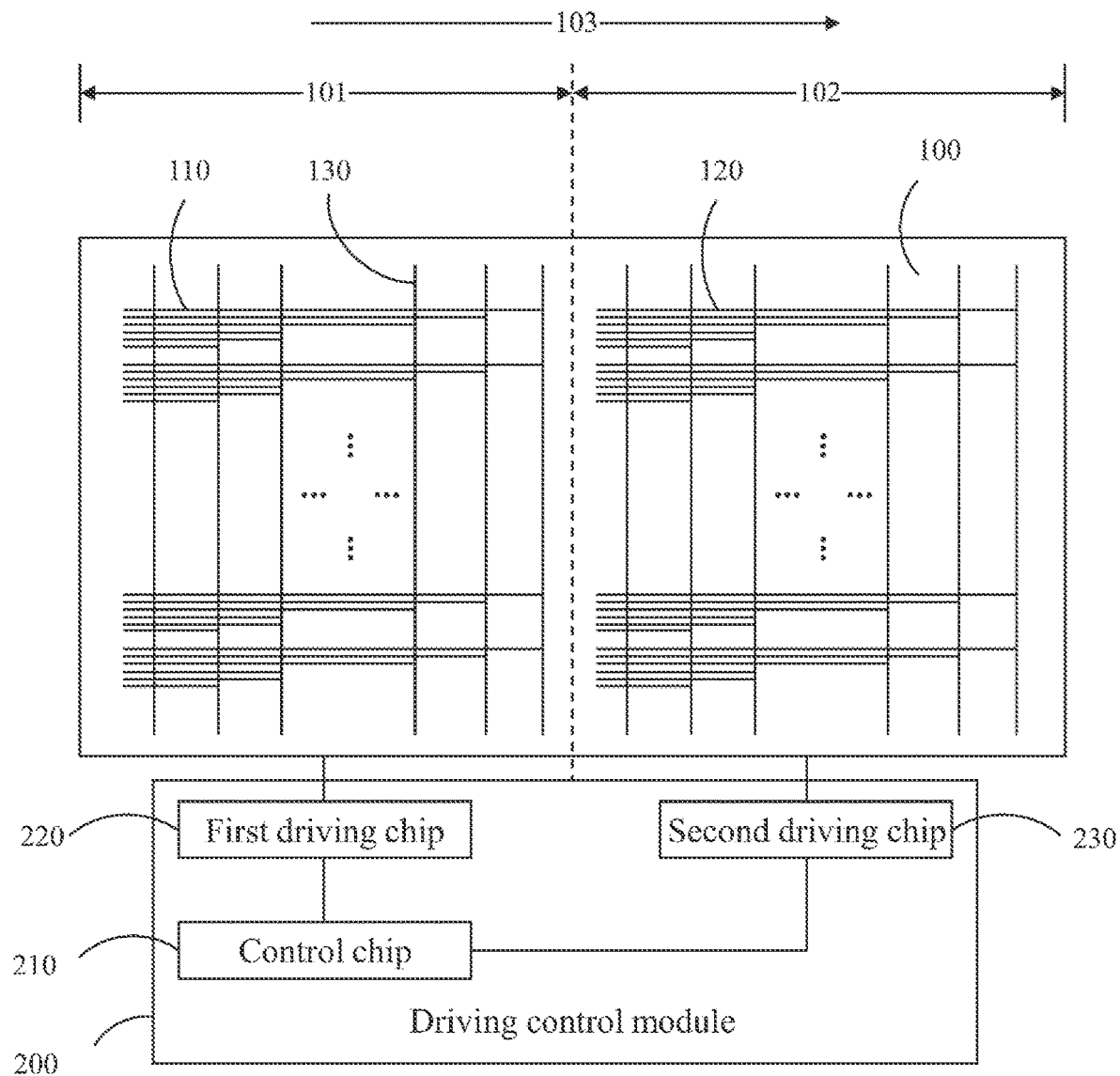
FIG. 1 is a structural schematic diagram of a display device provided by an embodiment of the present application.

Examples are described below with reference to the appended drawings, and the drawings illustrate particular embodiments in which the present application may be practiced. Directional terms mentioned in the present application, such as upper, lower, front, rear, left, right, in, out, side, etc., only refer to directions in the accompanying drawings. Thus, the adoption of directional terms is used to describe and understand the present application, but not to limit the present application. In the drawings, units of similar structures are using the same numeral to represent.

In the description of the present application, it should be understood that terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "multiple" is two or more, unless specifically defined otherwise.

In the description of the present application, it should be explained that terms "installation", "link", and "connection" should be understood broadly, unless explicitly stated and limited otherwise. For example, connection can be fixed connection or removable or integral connection, can be mechanical connection, electrical connection or mutual communication, can be direct connection or indirect connection through an intermedium, or can be the internal communication between two components or the mutual reaction between two components. For a skilled person in the art, the specific meanings of the above terms of the present application can be understood according to practical situations.

Technical solutions of the present application will now be described in conjunction with specific embodiments.

Currently, in order to display images in a high-gray-level display such as a 64-gray-level display, a display panel is at least divided into two display regions and is correspondingly provided with two driving integrated circuits (ICs) to drive the two display regions to display. However, because the two driving ICs drive the display panel with a same phase output, currents driving the two display regions are superimposed at a peak value, resulting in an excess peak current, which increases output requirements of a power supply and increases usage costs. Accordingly, the present application proposes a display device based on solving the above technical problem, and specific solutions are as follows.

Figure 2:
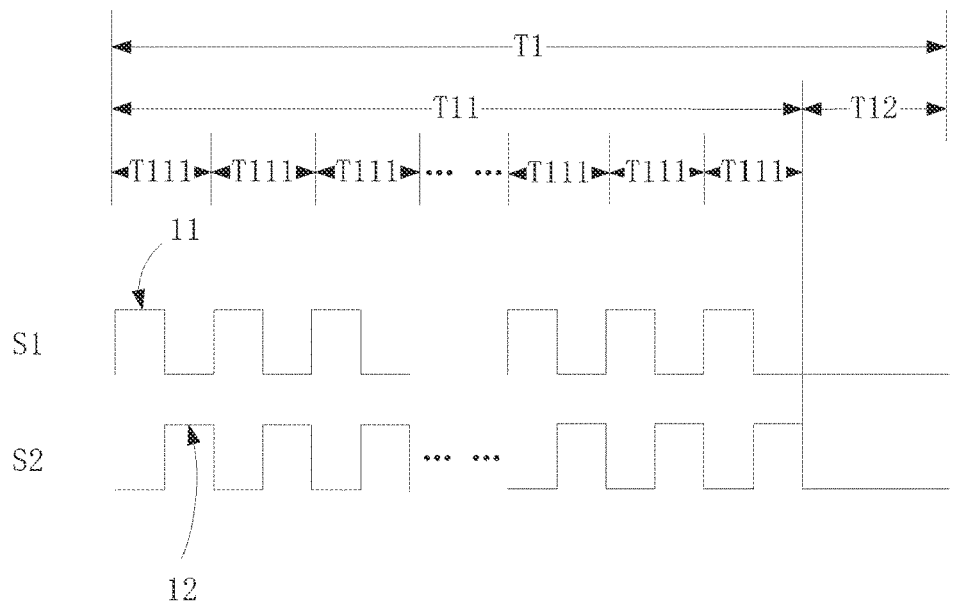
FIG. 2 is a timing diagram of a first data signal and a second data signal in a display period of the display device provided by an embodiment of the present application.

Please refer to FIGS. 1 and 2. The display device includes:

a display panel 100 including a first display region 101 and a second display region 102 arranged side by side along a first direction 103, wherein the first display region 101 is provided with a plurality of first data lines 110, the second display region 102 is provided with a plurality of second data lines 120, each of the first data lines 110 and each of the second data lines 120 are connected to a light-emitting diode (LED) (not shown); and a driving control module 200 connected to each of the first data lines 110 and each of the second data lines 120, wherein the driving control module 200 is configured to drive the first display region 101 and the second display region 102 to display. Understandably, a connection structure that the driving control module 200 is connected to each of the first data lines 110 and each of the second data lines 120 is not specifically shown in FIG. 1.

Within a display period T1 of one frame of the display panel 100, the driving control module 200 controls each of the first data lines 110 to output a first data signal S1 to the LED in the first display region 101 and controls each of the second data lines 120 to output a second data signal S2 to the LED in the second display region 102. A high electric potential period of the first data signal S1 is within a low electric potential period of the second data signal S2. A high electric potential period of the second data signal S2 is within a low electric potential period of the first data signal S1.

Understandably, the first direction 103 can be a direction parallel to the first data lines 110 or the second data lines 120. The first display region 101 or the second display region 102 of the display panel 100 can further be provided with scan lines 130. Each of the scan lines 130 can be connected to the driving control module 200. The high electric potential period of the first data signal S1 is within the low electric potential period of the second data signal S2, and the high electric potential period of the second data signal S2 is within the low electric potential period of the first data signal S1, so the high electric potential period of the first data signal S1 and the high electric potential period of the second data signal S2 do not have overlap periods. Therefore, the high electric potential period of the first data signal S1 and the high electric potential period of the second data signal S2 are prevented from being overlapped at any time, which causes peak currents to be overlapped at that time. In this embodiment, the driving control module 200 is configured to control the first data signal S1 for driving the first display region 101 to display and control the second data signal S2 for driving the second display region 102, so that the high electric potential period of the first data signal S1 is within the low electric potential period of the second data signal S2, and the high electric potential period of the second data signal S2 is within the low electric potential period of the first data signal S1. Therefore, the first data signal S1 and the second data signal S2 are arranged in alternate phases, which prevents an excess peak current due to the first data signal S1 and the second data signal S2 arranged in same phases, reduces a maximum current required for a display of the display device, reduces requirements of the display device for power supply specifications, and saves production costs and usage costs.

In an embodiment, as shown in FIG. 2, the high electric potential period of the first data signal S1 includes a plurality of first high electric potential subperiods 11, and the high electric potential period of the second data signal S2 includes a plurality of second high electric potential subperiods 12. The driving control module 200 controls each of the first high electric potential subperiods 11 and each of the second high electric potential subperiods 12 to be alternately arranged. Understandably, in a driving process of a high-gray-level display such as a 64-gray-level display, each gray level corresponds to each gray level period. As shown in FIG. 2, taking the 64-gray-level display as an example, the display period T1 of one frame of the display panel 100 includes 64 gray-level periods T111, and each of the gray-level periods T111 can include high electric potential and low electric potential. Specifically, the high electric potential period of the first data signal S1 can include 64 first high electric potential subperiods 11, and the high electric potential period of the second data signal S2 can include 64 second high electric potential subperiods 12. Within each of the gray-level periods T111, each of the first high electric potential subperiods 11 and each of the second high electric potential subperiods 12 are alternately arranged, so the high electric potential period of the first data signal S1 and the high electric potential period of the second data signal S2 do not overlap each other.

In an embodiment, as shown in FIG. 2, the display period T1 includes a driving display period T11 and a blank period T12. The driving control module 200 controls a sum of a time of the high electric potential period of the first data signal S1 and a time of the high electric potential period of the second data signal S2 to be equal to a time of the driving display period T11. Understandably, a plurality of display periods T1 include a plurality of driving display periods T11 and a plurality of blank periods T12. One blank period T12 is arranged between two adjacent driving display periods T11. Within the blank period T12, the driving control module 200 may not perform any driving operation on the display panel 100. Within the driving display period T11, the driving control module 200 controls each of the first data lines 110 to output the first data signal S1 to the LED in the first display region 101 and controls each of the second data lines 120 to output a second data signal S2 to the LED in the second display region 102. In this embodiment, the driving control module 200 can control the time of the high electric potential period of the first data signal S1 and the time of the high electric potential period of the second data signal S2 to be equal to a time of the driving display period T11. Obviously, with this control method, under a condition that the high electric potential period of the first data signal S1 and the high electric potential period of the second data signal S2 are prevented from being overlapped, a charging efficiency of the first data lines 110 and the second data lines 120 can be greatly ensured.

In an embodiment, of two adjacent first data lines 110, the driving control module 200 controls an electric potential value output from a longer one of the first data lines 110 within the high electric potential period of the first data signal S1 to be greater than an electric potential value output from a shorter one of the first data lines 110 within the high electric potential period of the first data signal S1.

In an embodiment, of two adjacent second data lines 120, the driving control module 200 controls an electric potential value output from a longer one of the second data lines 120 within the high electric potential period of the second data signal S2 to be greater than an electric potential value output from a shorter one of the second data lines 120 within the high electric potential period of the second data signal S2.

Understandably, because distances between the driving control module 200 and mini-LEDs in the display panel 100 are different, lengths of the first data lines 110 or lengths of the second data lines 120 are different, resulting in different resistance and capacitance delays. In this embodiment, electric potential values are output from the high electric potential period of the first data lines 110 or the second data lines 120 according to the different the lengths of the first data lines 110 or the second data lines 120, so as to solve different charging efficiency due to the resistance and capacitance delays. Specifically, of two adjacent first data lines 110, the driving control module 200 controls the electric potential value output from the longer one of the first data lines 110 within the high electric potential period of the first data signal S1 to be greater than the electric potential value output from the shorter one of the first data lines 110 within the high electric potential period of the first data signal S1. Meanwhile, of two adjacent second data lines 120, the driving control module 200 controls the electric potential value output from the longer one of the second data lines 120 within the high electric potential period of the second data signal S2 to be greater than the electric potential value output from the shorter one of the second data lines 120 within the high electric potential period of the second data signal S2.

In an embodiment, the driving control module 200 at least includes a control chip 210 and a first driving chip 220 and a second driving chip 230 connected to the control chip 210. The first driving chip 220 is connected to each of the first data lines 110. The second driving chip 230 is connected to each of the second data lines 120. Obviously, the first driving chip 220 is configured to drive the first display region 101 to display, and the second driving chip 230 is configured to drive the second display region 102 to display.

In an embodiment, the display panel 100 further includes a third display region (not shown). The third display region is arranged with the first display region 101 and the second display region 102 side by side along the first direction 103. The third display region is provided with a plurality of third data lines. Each of the third data lines is connected to an LED. The driving control module 200 is connected to each of the third data lines.

Within the display period T1 of one frame of the display panel 100, the driving control module 200 controls each of the third data lines to output a third data signal to the LED in the third display region. The high electric potential period of the first data signal S1, the high electric potential period of the second data signal S2, and a high electric potential period of the third data signal do not overlap each other. Understandably, the display panel 100 can be divided into a plurality of display regions. When the display panel 100 further includes a third display region, the driving control module 200 can control the high electric potential period of the first data signal S1, the high electric potential period of the second data signal S2, and the high electric potential period of the third data signal not to overlap each other. Therefore, the first data signal S1, the second data signal S2, and the third data signal are prevented from having common overlapping periods, which causes an excess peak current. A specific working principle is not repeated herein.

The present application further provides a driving method of a display device. The display device includes:
  a display panel 100 including a first display region 101 and a second display region 102 arranged side by side along a first direction 103, wherein the first display region 101 is provided with a plurality of first data lines 110, the second display region 102 is provided with a plurality of second data lines 120, and each of the first data lines 110 and each of the second data lines 120 are connected to a light-emitting diode (LED); and a driving control module 200 connected to each of the first data lines 110 and each of the second data lines 120, wherein the driving control module 200 is configured to drive the first display region 101 and the second display region 102 to display.

Figure 3:
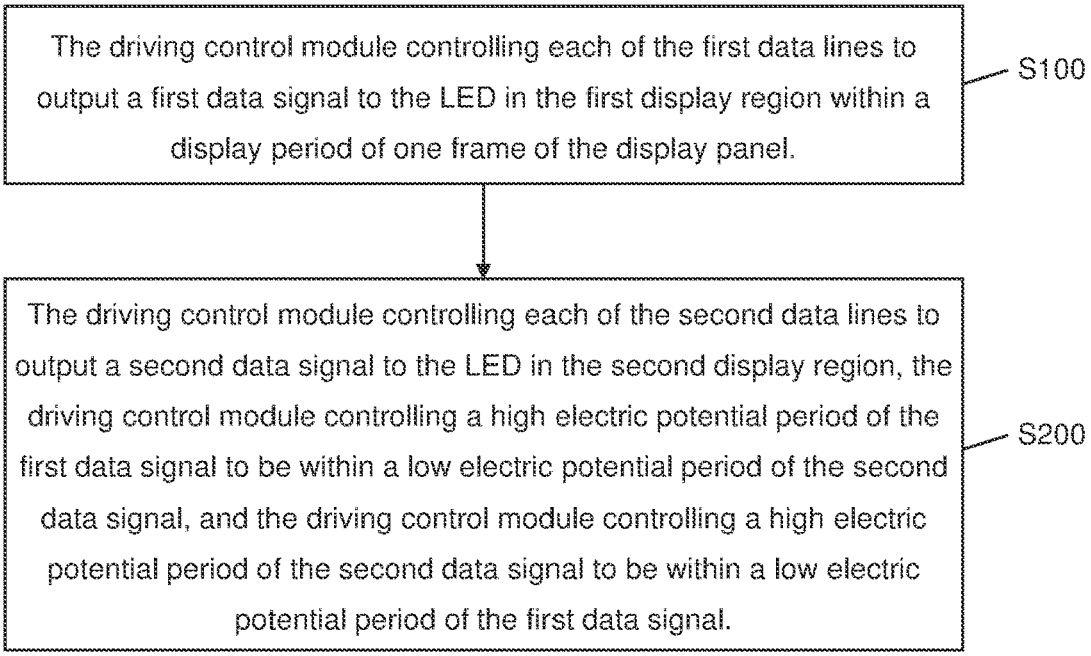
FIG. 3 is a flowchart of a driving method of the display device provided by an embodiment of the present application.

As shown in FIG. 3, the driving method of the display device includes steps of:

S100: the driving control module 200 controlling each of the first data lines 110 to output a first data signal S1 to the LED in the first display region 101 within a display period T1 of one frame of the display panel 100; and S200: the driving control module 200 controlling each of the second data lines 120 to output a second data signal S2 to the LED in the second display region 102, the driving control module controlling a high electric potential period of the first data signal S1 to be within a low electric potential period of the second data signal S2, and the driving control module 200 controlling a high electric potential period of the second data signal S2 to be within a low electric potential period of the first data signal S1.

In the driving method of the display device provided by an embodiment of the present application, in the step of the driving control module 200 controlling the high electric potential period of the first data signal S1 to be within the low electric potential period of the second data signal S2, and the driving control module 200 controlling the high electric potential period of the second data signal S2 to be within the low electric potential period of the first data signal S1 includes steps of:

the driving control module 200 controlling the high electric potential period of the first data signal S1 to include a plurality of first high electric potential subperiods 11, and the driving control module 200 controlling the high electric potential period of the second data signal S2 to include a plurality of second high electric potential subperiods 12; and the driving control module 200 controlling each of the first high electric potential subperiods 11 and each of the second high electric potential subperiods 12 to be alternately arranged.

In the driving method of the display device provided by an embodiment of the present application, the display panel 100 further includes a third display region arranged with the first display region 101 and the second display region 102 side by side along the first direction 103. The third display region is provided with a plurality of third data lines. Each of the third data lines is connected to an LED. The driving control module 200 is connected to each of the third data lines.

The driving method of the display device further includes a step of:

the driving control module controlling each of the third data lines to output a third data signal to the LED in the third display region within the display period T1 of one frame of the display panel 100, wherein the high electric potential period of the first data signal S1, the high electric potential period of the second data signal S2, and a high electric potential period of the third data signal do not overlap each other.

The present application configures the driving control module 200 to control the first data signal S1 for driving the first display region 101 to display and control the second data signal S2 for driving the second display region 102, so that the high electric potential period of the first data signal S1 is within the low electric potential period of the second data signal S2, and the high electric potential period of the second data signal S2 is within the low electric potential period of the first data signal S1. Therefore, the first data signal S1 and the second data signal S2 are arranged in alternate phases, which prevents an excess peak current due to the first data signal S1 and the second data signal S2 arranged in same phases, reduces a maximum current required for a display of the display device, reduces requirements of the display device for power supply specifications, and saves production costs and usage costs.

Although the present application has been disclosed above with the preferred embodiments, it is not intended to limit the present application. Persons having ordinary skill in this technical field can still make various alterations and modifications without departing from the scope and spirit of this application. Therefore, the scope of the present application should be defined and protected by the following claims and their equivalents.

What is claimed is:

1. A display device, comprising: a display panel comprising a first display region and a second display region arranged side by side along a first direction, wherein the first display region is provided with a plurality of first data lines, the second display region is provided with a plurality of second data lines, and each of the first data lines and each of the second data lines are connected to a light-emitting diode (LED); and a driving control module connected to each of the first data lines and each of the second data lines, wherein the driving control module is configured to drive the first display region and the second display region to display; wherein within a display period of one frame of the display panel, the driving control module controls each of the first data lines to output a first data signal to the LED in the first display region and controls each of the second data lines to output a second data signal to the LED in the second display region, a high electric potential period of the first data signal is within a low electric potential period of the second data signal, and a high electric potential period of the second data signal is within a low electric potential period of the first data signal; and wherein the high electric potential period of the first data signal comprises a plurality of first high electric potential subperiods, the high electric potential period of the second data signal comprises a plurality of second high electric potential subperiods, and the driving control module controls each of the first high electric potential subperiods and each of the second high electric potential subperiods to be alternately arranged.

2. The display device according to claim 1, wherein the display period comprises a driving display period and a blank period, the driving control module controls a sum of a time of the high electric potential period of the first data signal and a time of the high electric potential period of the second data signal to be equal to a time of the driving display period.

3. The display device according to claim 1, wherein of two adjacent first data lines, the driving control module controls an electric potential value output from a longer one of the first data lines within the high electric potential period of the first data signal to be greater than an electric potential value output from a shorter one of the first data lines within the high electric potential period of the first data signal.

4. The display device according to claim 1, wherein of two adjacent second data lines, the driving control module controls an electric potential value output from a longer one of the second data lines within the high electric potential period of the second data signal to be greater than an electric potential value output from a shorter one of the second data lines within the high electric potential period of the second data signal.

5. The display device according to claim 1, wherein the driving control module at least comprises a control chip and a first driving chip and a second driving chip connected to the control chip, the first driving chip is connected to each of the first data lines, and the second driving chip is connected to each of the second data lines.

6. A driving method of a display device, wherein the display device comprises:
- a display panel comprising a first display region and a second display region arranged side by side along a first direction, wherein the first display region is provided with a plurality of first data lines, the second display region is provided with a plurality of second data lines, and each of the first data lines and each of the second data lines are connected to a light-emitting diode (LED); and
- a driving control module connected to each of the first data lines and each of the second data lines, wherein the driving control module is configured to drive the first display region and the second display region to display;

wherein the driving method of the display device comprises steps of:
- the driving control module controlling each of the first data lines to output a first data signal to the LED in the first display region within a display period of one frame of the display panel; and
- the driving control module controlling each of the second data lines to output a second data signal to the LED in the second display region, the driving control module controlling a high electric potential period of the first data signal to be within a low electric potential period of the second data signal, and the driving control module controlling a high electric potential period of the second data signal to be within a low electric potential period of the first data signal.

7. The driving method of the display device according to claim 6, wherein in the step of the driving control module controlling the high electric potential period of the first data signal to be within the low electric potential period of the second data signal, and the driving control module controlling the high electric potential period of the second data signal to be within the low electric potential period of the first data signal comprises steps of:
- the driving control module controlling the high electric potential period of the first data signal to comprise a plurality of first high electric potential subperiods, and the driving control module controlling the high electric potential period of the second data signal to comprise a plurality of second high electric potential subperiods; and
- the driving control module controlling each of the first high electric potential subperiods and each of the second high electric potential subperiods to be alternately arranged.

8. A display device, comprising:
- a display panel comprising a first display region and a second display region arranged side by side along a first direction, wherein the first display region is provided with a plurality of first data lines, the second display region is provided with a plurality of second data lines, and each of the first data lines and each of the second data lines are connected to a light-emitting diode (LED); and
- a driving control module connected to each of the first data lines and each of the second data lines, wherein the driving control module is configured to drive the first display region and the second display region to display;

wherein within a display period of one frame of the display panel, the driving control module controls each of the first data lines to output a first data signal to the LED in the first display region and controls each of the second data lines to output a second data signal to the LED in the second display region, a high electric potential period of the first data signal is within a low electric potential period of the second data signal, and a high electric potential period of the second data signal is within a low electric potential period of the first data signal.

9. The display device according to claim 8, wherein the display period comprises a driving display period and a blank period, the driving control module controls a sum of a time of the high electric potential period of the first data signal and a time of the high electric potential period of the second data signal to be equal to a time of the driving display period.

10. The display device according to claim 8, wherein of two adjacent first data lines, the driving control module controls an electric potential value output from a longer one of the first data lines within the high electric potential period of the first data signal to be greater than an electric potential value output from a shorter one of the first data lines within the high electric potential period of the first data signal.

11. The display device according to claim 8, wherein of two adjacent second data lines, the driving control module controls an electric potential value output from a longer one of the second data lines within the high electric potential period of the second data signal to be greater than an electric potential value output from a shorter one of the second data lines within the high electric potential period of the second data signal.

12. The display device according to claim 8, wherein the driving control module at least comprises a control chip and a first driving chip and a second driving chip connected to the control chip, the first driving chip is connected to each of the first data lines, and the second driving chip is connected to each of the second data lines.

* * * * *